United States Patent [19]

Ido et al.

[11] Patent Number: 5,570,439
[45] Date of Patent: Oct. 29, 1996

[54] OPTICAL WAVEGUIDE DEVICE AND OPTICAL TRANSMISSION SYSTEM

[75] Inventors: Tatemi Ido; Hirohisa Sano, both of Kokubunji, Japan

[73] Assignee: Hitachi, Ltd., Tokyo, Japan

[21] Appl. No.: 178,678

[22] Filed: Jan. 7, 1994

[30] Foreign Application Priority Data

Jan. 19, 1993 [JP] Japan .................................. 5-006419

[51] Int. Cl.$^6$ ....................................................... G02B 6/34
[52] U.S. Cl. ................................................ 385/37; 385/131
[58] Field of Search ......................... 385/1–10, 37, 385/129–131

[56] References Cited

U.S. PATENT DOCUMENTS

| | | | |
|---|---|---|---|
| 3,619,796 | 11/1971 | Seidel | 359/328 |
| 5,022,730 | 6/1991 | Cimini et al. | 385/27 |

FOREIGN PATENT DOCUMENTS

| | | |
|---|---|---|
| 0345923 | 12/1989 | European Pat. Off. . |
| 0468715 | 1/1992 | European Pat. Off. . |
| 55-161201 | 12/1980 | Japan . |
| 56-1001 | 1/1981 | Japan . |
| 57-40207 | 3/1982 | Japan . |
| 57-66403 | 4/1982 | Japan . |
| 57-129036 | 8/1982 | Japan . |
| 59-126336 | 7/1984 | Japan . |
| 2161612 | 1/1986 | United Kingdom . |

OTHER PUBLICATIONS

Patent Abstracts of Japan, vol. 8, No. 250, 16 Nov. 1984 & JP-A-59 126 336 (Toukiyou Kogyo Daigaku), 20 Jul. 1994.
Patent Abstracts of Japan, vol. 4, No. 100, 18 Jul. 1980 & JP-A-55 059 403 (NTT), 2 May 1980.
Optics Letters, vol. 16, No. 5, 1 Mar. 1991, Washington, US, pp. 303–305; Francois Ouellette: *All–fiber filter for efficient dispersion compensation*.

*Primary Examiner*—John Ngo
*Attorney, Agent, or Firm*—Kenyon & Kenyon

[57] ABSTRACT

An optical signal is incident on a semiconductor optical waveguide with a grating and is reflected or transmitted therethrough to thereby perform dispersion compensation. Application of an electric field or implantation of carriers can be effected in the optical waveguide by means of electrodes attached in the optical waveguide. In addition, a temperature of the optical waveguide can be varied by a resistance heater. By using these measures, the dispersion compensation wavelength and the dispersion compensation intensity can be adjusted.

4 Claims, 4 Drawing Sheets

OPTICAL WAVEGUIDE DEVICE AND OPTICAL TRANSMISSION SYSTEM

BACKGROUND OF THE INVENTION

The present invention relates to an optical dispersion compensator or optical waveguide device which can be applied to an optical transmission system to remarkably increase a transmission distance and capacity thereof.

An optical fiber has a dispersion of refractive index and accordingly when an optical signal is transmitted through the optical fiber, a waveform thereof is deteriorated. Deterioration of the optical signal due to the dispersion of the fiber is a large factor for limiting the transmission distance and capacity of the optical transmission system. Even though the dynamic wavelength shift of an optical source itself can be suppressed by use of a single mode semiconductor laser, or adoption of an external modulation system, spread ($\Delta\lambda_0$) of wavelength of the optical signal due to a side-band occurring in high-speed intensity modulation of light wave can not be reduced by adoption of any modulation system. Since the spread $\Delta\lambda_0$ is proportional to a bit rate of the optical signal, the transmission distance in a next-generation ultrahigh-speed optical transmission system exceeding Gbit/sec is greatly limited by the unavoidable spread of the wavelength.

If an optical element having dispersion opposite to the dispersion in the optical fiber, that is, an optical dispersion compensator is inserted in the optical transmission path to cancel the dispersion in the deteriorated optical fiber, the optical signal waveform can be restored completely and a long-distance ultrahigh-speed optical transmission exceeding the limited distance can be attained. Methods of using an optical waveguide with a grating to realize a dispersion compensator are disclosed in, for example, Japanese Patent Documents JP-A-55-161201, JP-A-56-1001, JP-A-57-40207 and JP-A-57-66403. However, since these methods are intended to suppress a very large deterioration of waveform caused by multi-mode oscillation of a semiconductor laser, the dispersion compensation is merely performed discretely for mode waveforms and the dispersion compensation can not be performed continuously over the whole wavelength width constituting the optical pulse. A method capable of attaining the continuous dispersion compensation is disclosed in Japanese Patent Documents JP-A-57-129036. This method employs a grating in which pitch is gradually reduced, that is, a chirped grating to be able to perform the continuous dispersion compensation theoretically.

In the dispersion compensator described in the above-mentioned Japanese Patent Documents JP-A-57-129036, however, a wavelength area in which dispersion compensation can be performed, the intensity of dispersion compensation and the like are uniquely determined by a pitch of the grating, a structure of an optical waveguide and the like and there is no adjustment measure therefor. The oscillation wavelength of a semiconductor laser used in an actual optical transmission system is scattered over a wide range of several nanometers due to the element dependency, the temperature variation, the secular change and the like. This is ten or more times larger than the spread of a wavelength of the optical signal, that is, a wavelength width requiring the dispersion compensation. If dispersion compensation covering several nanometers is performed, the length of the compensator is ten or more times larger than a conventional device, so that it is difficult to manufacture and an optical loss of the dispersion compensator is increased. Further, the necessary magnitude of dispersion compensation is greatly dependent on the length of an optical fiber and scattered dispersion of the optical fiber. Accordingly, in order to actually adapt the dispersion compensator to the transmission system, it is indispensable to be able to adjust the wavelength and the magnitude of dispersion compensation to some extent after it is manufactured.

SUMMARY OF THE INVENTION

The present invention provides an optical dispersion compensator capable of adjusting the wavelength and the intensity of dispersion compensation electrically and/or thermally.

The present invention also attains a long distance and a large capacity of an optical transmission system by adapting the optical dispersion compensator to the optical transmission system.

The above can be achieved by impinging an optical signal onto a semiconductor optical waveguide with a grating to reflect or transmit it. A pitch of the grating or a structure of the optical waveguide is changed in the optical waveguide direction. Input and output ends of the optical waveguide are applied with a coating for controlling the optical transmissivity. Any or a plurality of semiconductor layers constituting the optical waveguide uses a multi-quantum well. The dispersion function is adjusted by applying an electric field or implanting carriers to the optical waveguide by means of electrodes attached to the semiconductor optical waveguide. The dispersion compensation function is adjusted by changing the temperature of the optical waveguide by means of a resistance heater attached in the vicinity of the optical waveguide or by changing the temperature of the whole dispersion compensator by means of a temperature adjusting device attached to the optical dispersion compensator. Specifically, the dispersion compensation function is adjusted by applying an uneven electric field, a carrier density and a temperature in the optical waveguide direction. Further, the above can be achieved by using the abovementioned optical dispersion compensator in any or a plurality of locations of a transmitter, a receiver and a repeater.

According to the present invention, an optical dispersion compensator can be realized which is capable of electrically and/or thermally adjusting the dispersion compensation wavelength and the dispersion compensation intensity. Further, application of the dispersion compensator according to the present invention to an optical transmission system can remarkably increase a transmission distance and a transmission capacity thereof.

DESCRIPTION OF THE PREFERRED EMBODIMENT

The operation principle of a semiconductor optical dispersion compensator according to the present invention is now described with reference to the accompanying drawings.

Figure 1:
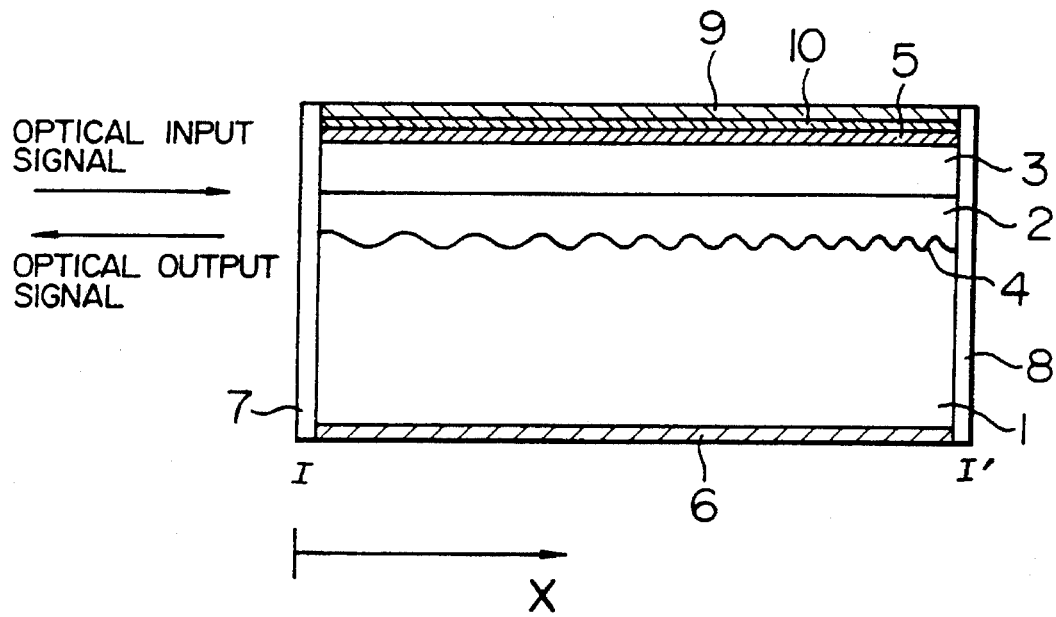
FIG. 1 is a sectional view illustrating a first embodiment of a dispersion compensator according to the present invention as viewed in the waveguide direction.

FIG. 1 is a sectional view illustrating an embodiment of a reflection type dispersion compensator according to the present invention as viewed in the direction of the optical waveguide. The refractive index of a semiconductor core layer 2 is selected to be larger than the refractive index of a semiconductor substrate 1 and a semiconductor clad layer 3 to thereby form an optical waveguide. A grating 4 is formed by providing irregularities in the hetero junction between the substrate 1 and the core layer 2. The grating 4 is a chirped grating in which its pitch (w) is varied in accordance with a distance (x). By using an effective refractive index (n) of the optical waveguide, the Bragg diffraction wavelength ($\lambda_B$) of the grating at a distance x is given by $$\lambda_B(x) = 2 \cdot n \cdot w(x) \quad (1)$$

An optical signal is incident on the dispersion compensator through an anti-reflection coating 7 and is transmitted in the formed optical waveguide while interacting with the chirped grating 4. A wavelength component satisfying the Bragg diffraction wavelength is selectively reflected in the optical signal at each position and is taken out from the dispersion compensator through the anti-reflection coating 7 again. The Bragg reflected position is different depending on the wavelength and accordingly a difference in an optical path, that is, a time delay occurs among the wavelengths. By providing the time delay so as to cancel a time delay due to the optical fiber, the dispersion compensation can be attained.

It is considered that a 100 km optical fiber having, for example, the wavelength dispersion of −20 psec/nm/km is used to transmit an optical signal having a center wavelength of 1550.0 nm and a wavelength spread of 0.2 nm. The transmitted optical component of 1550.1 nm has a dispersion delay of 400 psec relative to the optical component of 1549.0 nm. The delay of 400 psec corresponds to a length of 34.3 mm in the optical waveguide (for n=3.5). Accordingly, when a length of the device is set to be 17.2 mm or more and the Bragg reflection wavelength at a distance x (mm) is adapted to satisfy the following expression $$\lambda_B(x) = 1550.1 - x \cdot 0.01170 \ (nm) \quad (2)$$

the delay time for all wavelengths is compensated. Thus, as apparent from the expression (1), when the chirped grating 4 is formed to satisfy the following expression, the dispersion compensation can be attained theoretically.

$$w(x) = 221.44 - x \cdot 0.00167 \ (nm) \quad (3)$$

However, when scattering of a center wavelength of the optical signal in the actual transmission system and control of the effective refractive index n of the waveguide are considered, the wavelength effecting the dispersion compensation is not coincident with the wavelength of the optical signal and the dispersion compensation effective for the optical signal is not performed even if the chirped grating satisfying the expression (3) is formed and the compensator is manufactured. Thus, the optical dispersion compensation device is adapted so that an electric field can be applied to the semiconductor core layer by means of electrodes 5 and 6 to thereby increase n and carriers can be implanted to thereby reduce n. Accordingly, the dispersion compensation device can adjust the wavelength effecting the dispersion compensation within a range of several nanometers and can cause the wavelength effecting the dispersion compensation to be coincident with the wavelength of the optical signal. Further, since the temperature dependency of n is large, the dispersion compensation wavelength can be adjusted even by changing the temperature of the optical waveguide by means of a resistance heater 9 provided through an insulative protection layer 10. Such adjustment utilizes the fact that the refractive index of a semiconductor is varied largely electrically and thermally and can be attained for the first time by manufacturing the compensator with a semiconductor. In addition, the anti-reflection coating 7 is applied so as to reduce an insertion loss of the dispersion compensator and a high-reflection coating 8 is also applied so as not to extinguish an output light even if the compensation wavelength is shifted from the wavelength of the signal.

Figure 2:
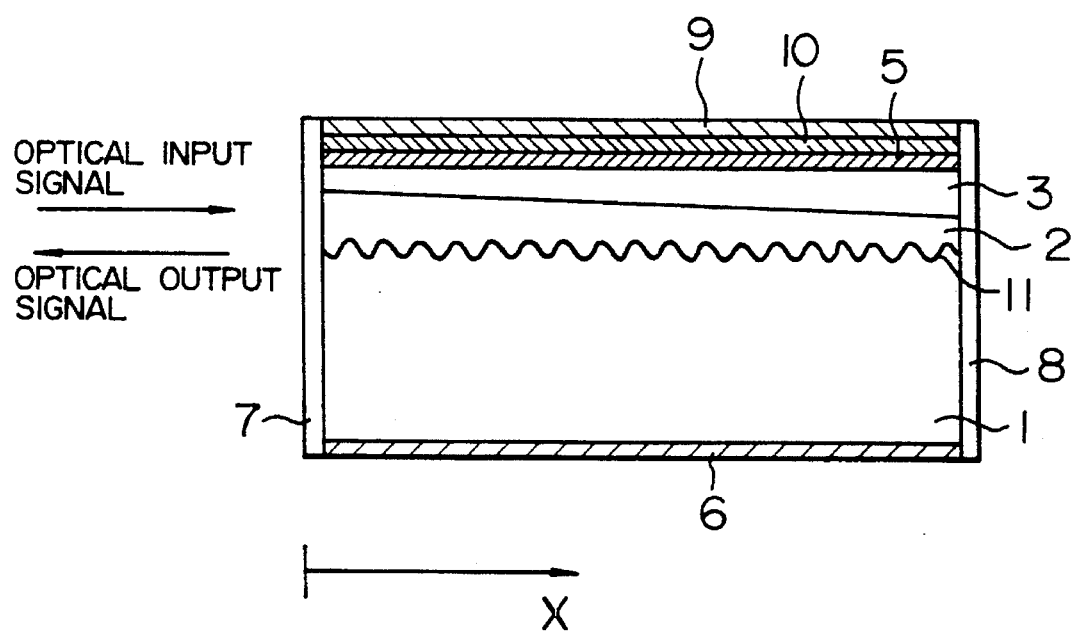
FIG. 2 is a sectional view illustrating a second embodiment of a dispersion compensator according to the present invention as viewed in the waveguide direction.

FIG. 2 is a sectional view illustrating another embodiment of a reflection type dispersion compensator according to the present invention as viewed in the waveguide direction. The dispersion compensator is the same as that of FIG. 1 except that a thickness of the semiconductor core layer 2 is varied in the x direction and the pitch of the grating 11 is constant regardless of the distance (x). In general, since the effective refractive index (n) of the optical waveguide is greatly dependent on a structure of the optical waveguide, the optical waveguide with the effective chirped grating in which the Bragg diffraction wavelength ($\lambda_B$) is varied in the optical waveguide direction can be realized by changing the structure of the optical waveguide in the waveguide direction even if a uniform grating is used. In the optical waveguide shown in FIG. 2, the fact that $\lambda_B$ becomes smaller in a portion where the core layer 2 is thinner since n is smaller and $\lambda_B$ becomes larger in a portion where the core layer 2 is thicker since n is larger is used to realize the optical waveguide with the grating equivalent to the chirped grating 4 of FIG. 1. Accordingly, the dispersion compensation can be attained by the same principle as that of FIG. 1. Variation $\Delta n$ of the effective refractive index occurring by applying an electric field to the semiconductor core layer 2 or implanting carriers has the dependency of x because of variation of the thickness of the core layer. This means that differential of x for the Bragg wavelength ($d\lambda_B/dx$) is varied by application of an electric field or implantation of carriers, that is, magnitude of dispersion compensation can be varied electrically. Accordingly, combination of this and temperature control of the optical waveguide by the resistance heater 9 can control both of the dispersion compensation wavelength and the dispersion compensation magnitude electrically.

Figure 3:
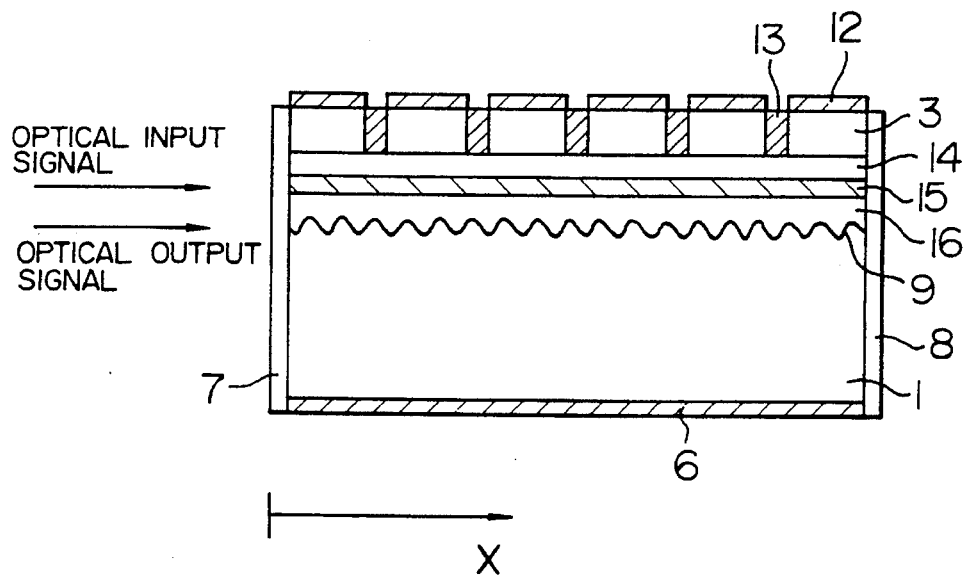
FIG. 3 is a sectional view illustrating a third embodiment of a dispersion compensator according to the present invention as viewed in the waveguide direction.

FIG. 3 is a sectional view illustrating another embodiment of a reflection type dispersion compensator according to the present invention as viewed in the waveguide direction. The dispersion compensator is identical with that of FIG. 1 except that there are provided divided electrodes 12, the pitch of the grating 9 is constant regardless of a distance (x), and a multi-quantum well layer 15 and upper and lower guide layers 14 and 16 are used instead of the semiconductor core layer. Numeral 13 denotes an electrode separation portion. The dispersion compensator applies currents and voltages to the divided electrodes 12, respectively, to thereby control the respective effective refractive indices in the divided areas independently, so that effectively various chirped gratings can be realized electrically and accordingly the degree of freedom of the dispersion compensation is large. For example, if voltages proportional to a distance (x) are applied to the electrodes, the chirped grating having the Bragg diffraction wavelength varied in proportion to the distance (x) can be attained effectively to perform the dispersion compensation in the same manner as FIG. 1. At this time, the dispersion compensation wavelength can be adjusted by an average value of the voltages applied to the electrodes and the dispersion compensation intensity can be also adjusted by the gradient of the voltages relative to the distance (x). Further, since the dispersion compensator uses the multi-quantum well layer 15, a large variation of the effective refractive index is obtained as compared with a bulk semiconductor upon application of the electric field and accordingly the adjustment ranges of the dispersion compensation wavelength and the dispersion compensation intensity are larger correspondingly.

Figure 4:
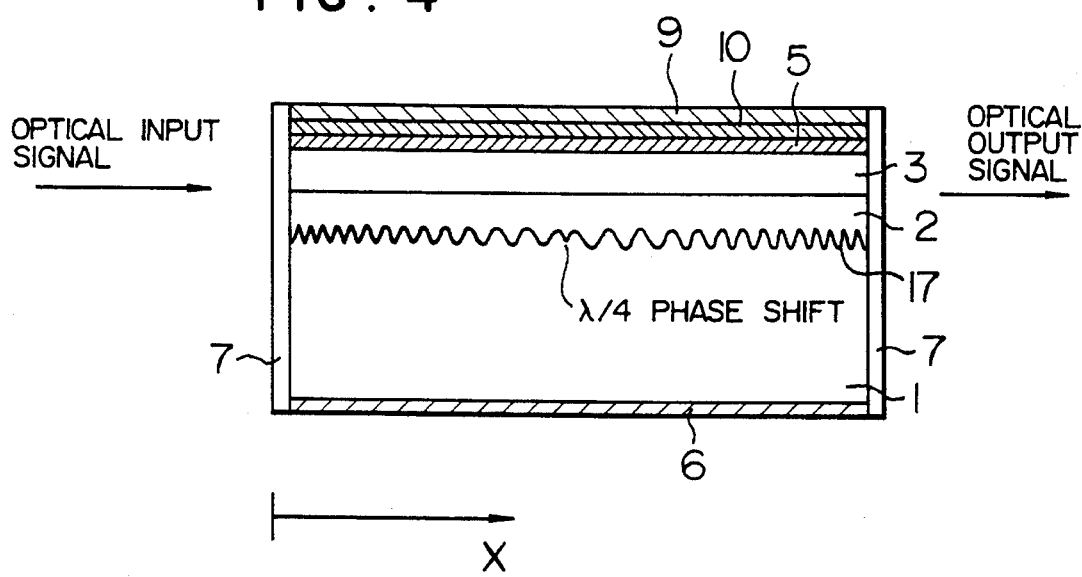
FIG. 4 is a sectional view illustrating a fourth embodiment of a dispersion compensator according to the present invention as viewed in the waveguide direction.

FIG. 4 is a sectional view illustrating an embodiment of a transmission type dispersion compensator according to the present invention as viewed in an axial direction. The dispersion compensator is identical with that of FIG. 1 except that a chirped grating 17 is formed symmetrically in respect to λ/4 phase shift of the center and anti-reflection coatings are disposed in both sides because of the transmission type. An optical signal incident on this device is taken out from the opposite end surface through a kind of optical resonator formed by the Bragg reflection of the symmetrical chirped grating. Since the chirped grating is used, an effective resonator length can be varied in respect to wavelengths to thereby attain the dispersion compensation. This device can also electrically adjust the dispersion compensation wavelength and the dispersion compensation intensity by means of the methods described in conjunction with FIGS. 1 to 3.

An embodiment of the present invention is now described with reference to the drawing.

(Embodiment 1)

Figure 5A:
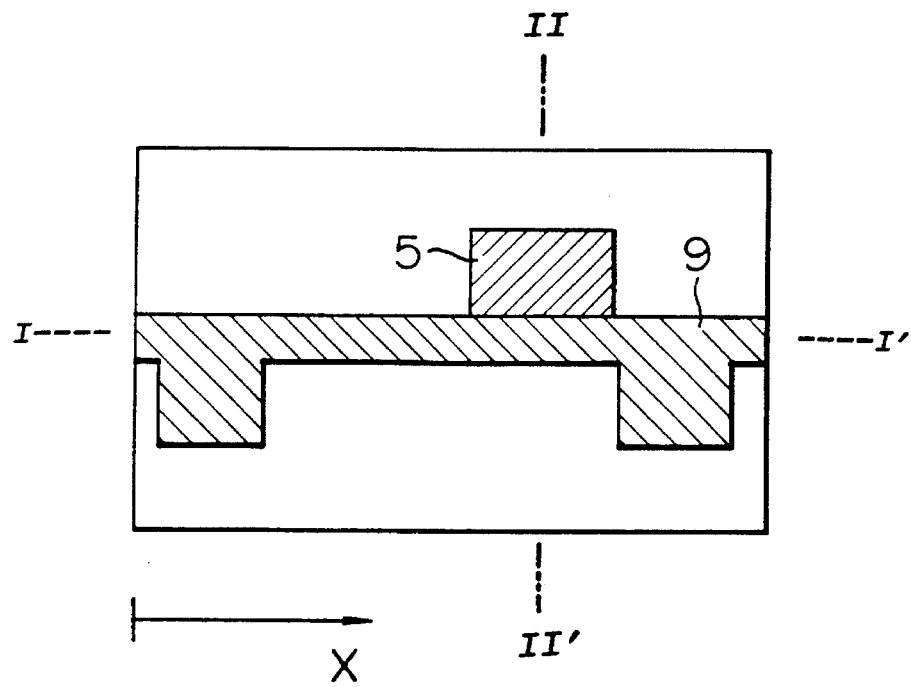
FIG. 5A is a plan view illustrating the first embodiment of the dispersion compensator according to the present invention.
Figure 5B:
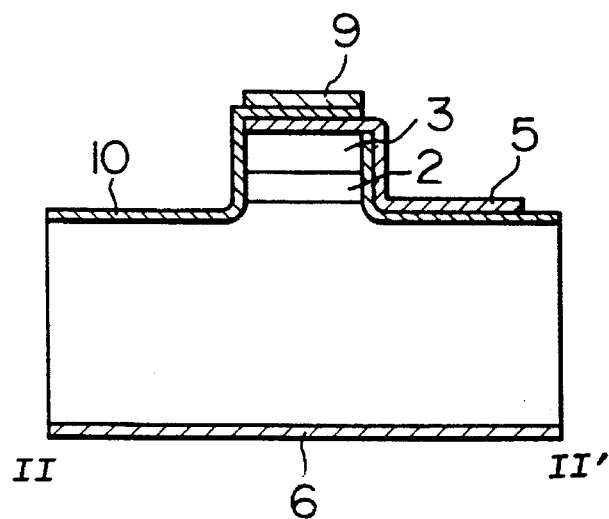
FIG. 5B is a sectional view illustrating the first embodiment of the dispersion compensator according to the present invention as viewed in the direction perpendicular to the waveguide.

FIG. 5A is a plan view of a reflection type optical dispersion compensator according to the embodiment 1. FIG. 1 is a sectional view taken along line I—I' of FIG. 5A and FIG. 5B is a sectional view taken along line II—II' of FIG. 5A. A photo-mask for a grating was manufactured by a ruling machine and the chirped grating 4 having the beat interval satisfying the expression (3) was formed on the n-InP substrate 1 by means of the contact exposure of the photo-mask and the wet etching. Then, the MOCVD method was used to grow a non-doped InGaAsP (band gap wavelength 1.3 μm) optical core layer 2 having a thickness of 0.2 to 0.5 μm and a p-InP clad layer 3 having a thickness of 2 to 3 μm. After stripes having a width of about 1 to 3 μm were formed by etching, an $SiO_2$ passivation film 16, a p electrode 5, a platinum heater 9 and an n electrode 6 were formed. Finally, the substrate was cut into a size of 5×20 mm to form walls, and an $SiN_x$ anti-reflection coating 7 was applied on one incident end surface while an a-Si/$SiO_2$ high-reflection coating 8 was applied on the other end surface.

Figure 6:
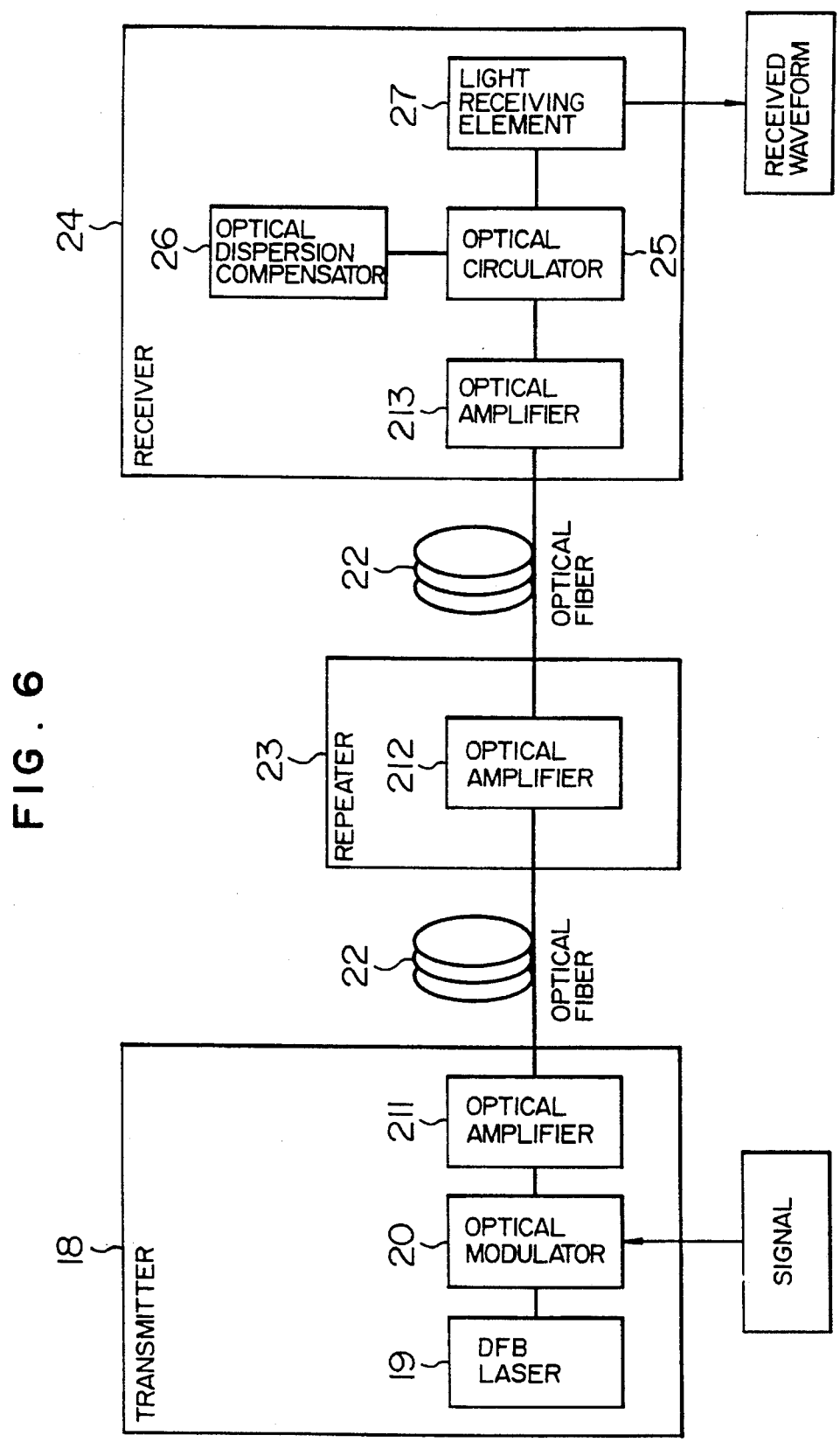
FIG. 6 schematically illustrates an embodiment in which the dispersion compensator according to the present invention is applied to an optical transmission system.

FIG. 6 schematically illustrates a transmission apparatus used in an experiment. A transmitter 18 including a DFB laser 19 (oscillation wavelength 1.550 μm), an optical modulator 20 and an optical amplifier 211 is applied with an NRZ pseudo random signal of 20 Gbit/sec to generate an optical signal. After the optical signal was transmitted through an optical fiber 22 having zero dispersion wavelength of 1.3 μm and having the total length of 100 km, the signal was received by a receiver 24 including an optical amplifier 213 and a light receiving device 27 and a waveform of the received signal was observed by a sampling oscilloscope. At this time, an optical repeater 23 including an amplifier 212 is inserted on the way of the fiber to complement a transmission loss. When the optical amplifier 213 was directly connected to the light receiving device 27 without using the dispersion compensator, the received waveform was deteriorated remarkably and a satisfactory waveform of the received optical signal can not be obtained. However, when the reflection type dispersion compensator 26 shown in FIG. 1 was inserted between the optical amplifier 213 and the light receiving device 27 by means of an optical circulator 25 and the voltage and current applied to the electrodes 5 and 6 of the compensator were adjusted, a satisfactory received waveform having a sufficient eye opening was obtained. At this time, however, polarization of the incident light on the compensator was adjusted so that only light of TE mode exists in the optical waveguide of the dispersion compensator. Then, although the oscillation wavelength of the DFB laser 19 of the transmitter was varied within the range of ±3 nm, a satisfactory received waveform was obtained in any wavelength by readjusting the current and voltage applied to the electrodes 5 and 6. In stead of the adjustment of the voltage and current applied to the electrodes 5 and 6, by adjusting a current flowing through the platinum heater 9 or by adjusting a temperature of the whole compensator, a satisfactory received waveform was also obtained. In addition, even when the optical circulator 25 and the dispersion compensator 26 was inserted just after the optical modulator 20 of the transmitter or just after the optical amplifier 212 of the optical repeater, a satisfactory received waveform was obtained by performing the same adjustment.

(Embodiment 2)

A sectional view of the reflection type dispersion compensator according to the embodiment 2 as viewed in the waveguide direction is shown in FIG. 2. The uniform grating 11 (beat interval 221.4 nm) was manufactured by the interference exposure method using a He-Cd laser and the wet etching. An InGaAsP optical core layer 2 having a width varying by about 20% in the waveguide direction was grown by the MOCVD selective area growth using unparallel $SiO_2$ stripes. Other structure is the same as that of the embodiment 1 and the same process was used to manufacture the dispersion compensator.

The manufactured dispersion compensator was estimated by means of the same transmission apparatus (FIG. 6) as that of the embodiment 1. When transmission of the total fiber length of 100 km was performed for the oscillation wavelength of the semiconductor laser of 1.550 μm and the current and voltage applied to the electrodes 5 and 6 and the current flowing through the platinum heater 9 were adjusted, a satisfactory received waveform having a sufficient eye opening was obtained. Then, when the same adjustment was made while the total fiber length is changed to 50 km and 150 km, a satisfactory received waveforms were also obtained in any cases. Further, even when another pair of optical circulator and dispersion compensator were inserted just after the optical modulator 20 and the same adjustment was made for the two compensators, a satisfactory received waveform was obtained.

(Embodiment 3)

A sectional view of the reflection type dispersion compensator according to the embodiment as viewed in the waveguide direction is shown in FIG. 3. An n-InGaAsP (band gap wavelength is 1.15 μm) lower guide layer 16 having a thickness of 0.1 to 0.2 μm, the InGaAs/InP multi-quantum well layer 15 (band gap wavelength is 1.45 μm and the number of quantum wells is 10) a p-InGaAsP upper guide layer 14 having a thickness of 0.1 to 0.2 μm, and a p-InP clad layer 3 having a thickness of 2 to 3 μm were grown by the MOCVD method on the n-InP substrate in which the same uniform grating 11 as that of the embodiment 2 is formed. Part of the clad layer was subjected to etching and was then buried with an Fe doped InP 13. Then, after the optical waveguide was formed by dry etching and an $SiO_2$ passivation film was formed, the multi-electrode 12 was formed. Thereafter, the dispersion compensator was manufactured by the same process as that of the embodiment 1.

The manufactured dispersion compensation device was estimated by means of the same transmission apparatus (FIG. 6) as that of the embodiment 1. When transmission for the total fiber length of 100 km was performed for the wavelength of 1.550 μm and the current and voltage applied to the multi-electrode 12 were adjusted, a satisfactory received waveform having a sufficient eye opening was obtained. Further, even if the total fiber length was changed to 50 km and 100 km or the laser oscillation wavelength was varied within ±3 nm, a satisfactory received waveform was obtained by making the same adjustment again.

(Embodiment 4)

A sectional view of the transmission type dispersion compensator according to the embodiment as viewed in the waveguide direction is shown in FIG. 4. A grating photomask was formed by a ruling machine and the chirped grating 17 with λ/4 shift having a pitch (w) satisfying the following equation was manufactured on the surface of the n-InP substrate 1 by means of the contact exposure and the wet etching.

$$w(x) = 221.43 + |x| \cdot 0.00092 \ (nm) \quad (4)$$

Further, anti-reflection coatings are applied on both end surfaces to form the transmission type dispersion compensator. Other structure is the same as that of the embodiment 1 and the transmission type dispersion compensator was manufactured by the same process.

The manufactured device was estimated by the same transmission apparatus as that of the embodiment 1. However, since the compensator is of the transmission type, the compensator is directly inserted in the optical path without using the optical circulator. When transmission for the total fiber length of 100 km was made for a wavelength of 1.550 μm and currents and voltages applied to the multi-electrode 11 and a current flowing through the resistance heater 9 were adjusted, a satisfactory received waveform having a sufficient eye opening was obtained. Further, even if the transmission wavelength was varied within a range of ±3 nm, a satisfactory received waveform was obtained by the same adjustment.

In the embodiments, the grating is manufactured on the substrate, while even if the grating is manufactured between any layers constituting the optical waveguide, the dispersion compensator can be attained similarly. Further, the embodiments are applied to the ridge type optical waveguide manufactured by etching, while it is needless to say that the dispersion compensator can be attained for any optical waveguide such as a slab type optical waveguide and a buried hetero type optical waveguide.

What is claimed is:

1. An optical waveguide device comprising a semiconductor optical waveguide with a grating, wherein a Bragg diffraction wavelenght $\lambda_B$ of the grating is defined as $\lambda_B = 2 \ nw$;

wherein n is an effective refractive index of said semiconductor optical waveguide and w is a pitch of said grating; and the optical waveguide device further comprising coatings applied on input and output end surfaces of said optical waveguide to control a transmissivity of light.

2. An optical waveguide device comprising a semiconductor optical waveguide with a grating, wherein a Bragg diffraction wavelength $\lambda_B$ of the grating is defined as $\lambda_B = 2 \ nw$;

wherein n is an effective refractive index of said semiconductor optical waveguide and w is a pitch of said grating;

wherein said grating reflects or transmits an optical signal incident thereon to thereby perform dispersion compensation; and wherein said optical waveguide device further comprises:
a heater mounted in the vicinity of said semiconductor optical waveguide to change a temperature of said semiconductor optical waveguide or a temperature adjusting device having said optical waveguide device mounted therein to change a temperature of all of said optical waveguide device to thereby adjust a dispersion compensation function.

3. An optical dispersion compensator for reducing deterioration of an optical signal due to dispersion of an optical fiber by compensating for the dispersion of the optical fiber, the optical dispersion compensator comprising a semiconductor optical waveguide with a grating, wherein a Bragg diffraction wavelength $\lambda_B$ of the grating is defined as $\lambda_B = 2 \ nw$;

wherein n is an effective refractive index of said semiconductor optical waveguide and w is a pitch of said grating;

further comprising coatings applied on input and output end surfaces of said optical waveguide to control transmissivity of light.

4. An optical dispersion compensator for reducing deterioration of an optical signal due to dispersion of an optical fiber by compensating for the dispersion of the optical fiber, the optical dispersion compensator comprising a semiconductor optical waveguide with a grating, wherein a Bragg diffraction wavelength $\lambda_B$ of the grating is defined as $\lambda_B = 2 \ nw$;

wherein n is an effective refractive index of said semiconductor optical waveguide and w is a pitch of said grating.

* * * * *

UNITED STATES PATENT AND TRADEMARK OFFICE
CERTIFICATE OF CORRECTION

PATENT NO.   : 5,570,439
DATED        : October 29, 1996
INVENTOR(S)  : Tatemi IDO, et. al.

It is certified that error appears in the above-identified patent and that said Letters Patent is hereby corrected as shown below:

| Column | Line | |
|---|---|---|
| 1 | 46 | Change "Documents" to --Document--. |
| 1 | 51 | Change "Documents" to --Document--. |
| 3 | 57 | Change "(mn)" to --(nm)--. |
| 6 | 30 | Change "In stead" to --Instead--. |
| 6 | 48 | Before "wet" delete "the". |
| 6 | 65 | Before "satisfactory" delete "a". |
| 6 | 67 | Change "were" to --was--. |
| 8 | 18 | After "and" start new paragraph and insert the following: --wherein a structure of said optical waveguide is varied in a direction of said optical waveguide;--. |

UNITED STATES PATENT AND TRADEMARK OFFICE
CERTIFICATE OF CORRECTION

PATENT NO. : 5,570,439
DATED : October 29, 1996
INVENTOR(S) : Tatemi IDO, et. al.

Page 2 of 2

It is certified that error appears in the above-identified patent and that said Letters Patent is hereby corrected as shown below:

Column    Line
8    64    After "grating" change "." to --;--; start new paragraph and insert the following:

--wherein said grating reflects or transmits an optical signal incident thereon to thereby perform dispersion compensation; and wherein said optical waveguide device further comprises:

a heater mounted in the vicinity of said semiconductor optical waveguide to change a temperature of said semiconductor optical waveguide or a temperature adjusting device having said optical waveguide device mounted therein to change a temperature of all of said optical waveguide device to thereby adjust a dispersion compensation function.--.

Signed and Sealed this

Fourth Day of March, 1997

Attest:

BRUCE LEHMAN

*Attesting Officer*    Commissioner of Patents and Trademarks